United States Patent [19]

Ashida

[11] 4,112,358

[45] Sep. 5, 1978

[54] DIGITAL FREQUENCY MEASURING DEVICE

[75] Inventor: Hitoshi Ashida, Gyoda, Japan

[73] Assignee: Takeda Riken Kogyo Kabushikikaisha, Tokyo, Japan

[21] Appl. No.: 785,909

[22] Filed: Apr. 8, 1977

[30] Foreign Application Priority Data

Apr. 9, 1976 [JP] Japan .................................. 51-40655

[51] Int. Cl.² ............................................ G01R 23/02
[52] U.S. Cl. ................................ 324/78 D; 324/77 R; 324/79 D
[58] Field of Search ................. 324/78 D, 79 D, 77 R, 324/99 D, 186; 328/140.39, 141; 235/151.31, 92 T, 92 TF

[56] References Cited

U.S. PATENT DOCUMENTS 3,638,001   1/1972   Gordon .............................. 324/78 D
3,729,677   4/1973   Band .................................. 324/78 D Primary Examiner—M. Tokar
Attorney, Agent, or Firm—Pollock, Vande Sande and Priddy

[57] ABSTRACT

A digital frequency measuring device in which pulses of an input signal are counted for a certain period of time under the control of a gate signal and the count value is displayed in a digital form. A fraction detector circuit is provided for measuring the time interval or difference $\Delta T_1$ between the leading edge of the gate signal and an input pulse arriving after it, the time interval or difference $\Delta T_2$ between the trailing edge of the gate signal and an input pulse arriving after it and the unit period T of the input pulse signal, and performing an operation corresponding to $(\Delta T_1 - \Delta T_2/T)$. The result of operation is converted into the corresponding digital value, which is displayed as a fraction value of the abovesaid count value.

5 Claims, 6 Drawing Figures

DIGITAL FREQUENCY MEASURING DEVICE

BACKGROUND OF THE INVENTION

This invention relates to a digital frequency measuring device for measuring an input signal frequency in the digital manner.

In ordinary digital frequency measuring devices, the signal to be measured is converted into pulses, and applied to a gate for counting the number of pulses passing therethrough for a certain period of time, and then the count value is displayed in a digital form. With such a method, however, since the signal to be measured and the gate signal are not synchronized with each other, an error appears in the neighborhood of each of the leading and trailing edges of the gate signal. Especially, as the gate time approaches the pulse interval of the signal to be measured, the error increases. For example, in the case of measuring a 1 Hz signal using a gate time of 1 second, an error of ±1 Hz appears in the measurement.

Then, the prior art employs the following method to provide for enhanced resolving power. That is, a gate signal synchronized with the signal to be measured is applied to two gate circuits to control them, by which the signal to be measured and the reference clock signal are respectively controlled to obtain gate outputs. The gate outputs are respectively counted by two counters. Then, an integral value of the frequency to be measured is obtained from the count value of the signal to be measured, and values corresponding to errors between the count value of the clock signal and clock pulses appearing at the leading and trailing edges of the gate signal are obtained. And then an operation is performed based on the abovesaid values to obtain a fraction value smaller than one period of the signal to be measured. Since this system performs a numerical operation, it is referred to as the computing counter system, and known to be capable of highly accurate frequency measurement. However, this system requires two counters and a divider, too, and hence has the disadvantage that the construction is relatively complicated as a whole.

One object of this invention is to provide a digital frequency measuring device which is relatively simple in construction and inexpensive but has substantially the same performance as the conventional computing counter system.

Another object of this invention is to provide a digital frequency measuring device which is capable of achieving highly accurate frequency measurement in a short time.

Another object of this invention is to provide a digital frequency measuring device which is capable of achieving highly accurate frequency measurement up to a high frequency region in a short time.

Still another object of this invention is to provide a digital frequency measuring device with which it is also possible to measure time intervals with high resolving power.

SUMMARY OF THE INVENTION

In a frequency measuring device in which a gate circuit is controlled by a gate signal, pulses of an input signal having passed through the gate circuit are counted and the count value is displayed in the form of a digital value, a fraction detector circuit is provided which is supplied with the input pulses and the gate signal to detect the time intervals or differences $\Delta T_1$ and $\Delta T_2$ between the leading and trailing edges of the gate signal and the input pulses arriving immediately after them, respectively, and the period T of the input pulse signal and in which an operation $(\Delta T_1 - \Delta T_2)/T$ is performed. The result of operation is converted into the corresponding digital value, and displayed as a fraction of the abovesaid count value. In the fraction detector circuit, the operation $(\Delta T_1 - \Delta T_2)/T$ can be achieved after the time differences $\Delta T_1$ and $\Delta T_2$ and the period T are converted into voltages. That is, certain values are integrated respectively for the periods of time $\Delta T_1$, $\Delta T_2$ and T to obtain voltages $\Delta V_1$, $\Delta V_2$ and V. By performing an operation $(\Delta V_1 - \Delta V_2)/V$, an accurate operation can be achieved relatively easily, even if the time intervals $\Delta T_1$ and $\Delta T_2$ are very short. Further, the voltages $\Delta V_1 - \Delta V_2$ and V are supplied to a digital voltmeter and the voltage value $\Delta V_1 - \Delta V_2$ is measured using the voltage V as the reference, by which the operation $(\Delta V_1 - \Delta V_2)/V$ is performed in the form of a digital value. Thus, in the frequency measuring device of this invention, only one counter is employed and the operation involved is relatively simple. Accordingly, a measuring device of the same performance as the conventional computing counter system can be obtained at lower cost. By the additional provision of a pulse interval measuring circuit, the pulse interval, that is, time, can also be measured with high accuracy. Namely, by a gate signal generated from the pulse interval measuring circuit, the gate circuit is opened to pass therethrough clock pulses and the number of clock pulses passing through the gate circuit is counted and, at the same time, the gate signal and the clock pulses are applied to the fraction detector circuit.

DESCRIPTION OF THE PREFERRED EMBODIMENTS

Figure 1:
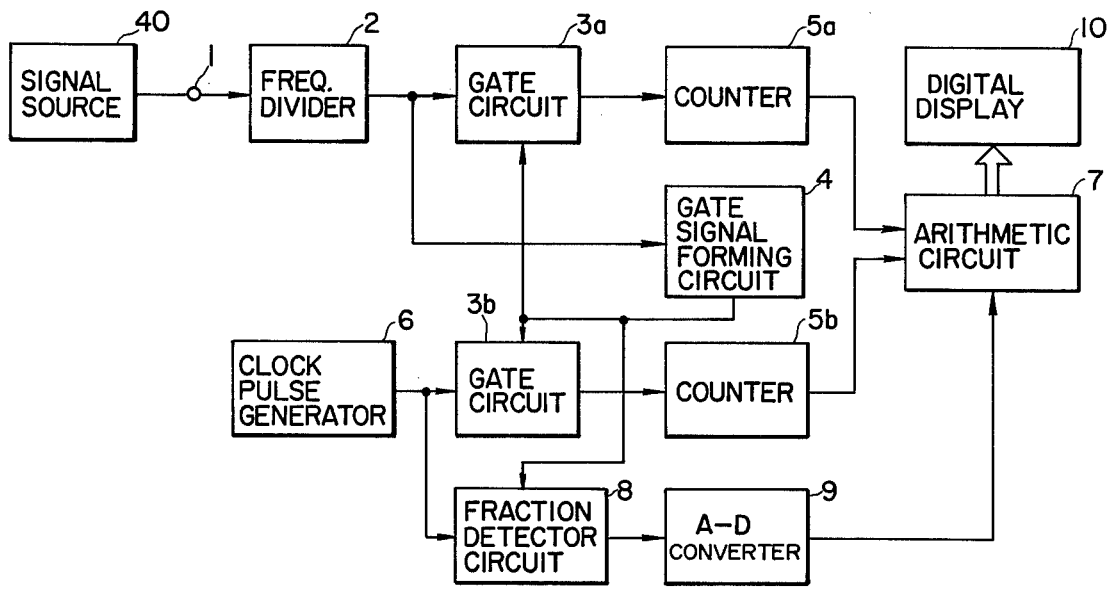
FIG. 1 is a block diagram showing a conventional highly accurate digital frequency measuring device.
Figure 2:
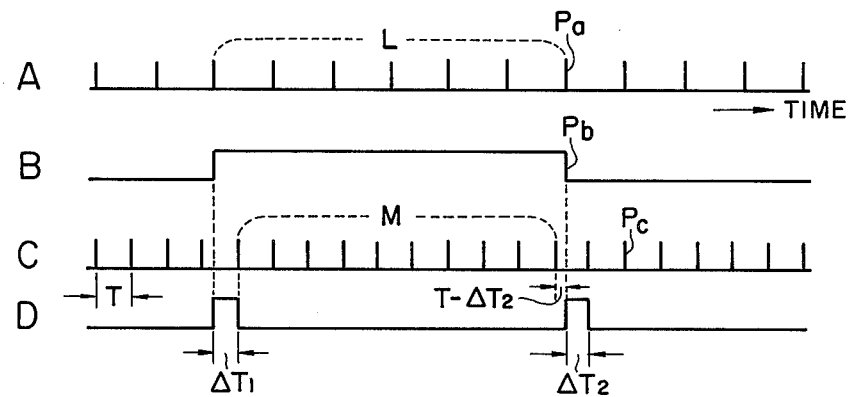
FIG. 2 is a waveform diagram explanatory of the operation of the device shown in FIG. 1.

Referring first to FIG. 1, a conventional computing counter system will be described. A signal Pa to be measured is supplied to a terminal 1 from a source 40 of the signal to be measured, and frequency divided by a frequency divider 2 down to 1/N, as shown in FIG. 2A, thereafter being applied to a gate circuit 3a. The frequency-divided output from the frequency divider 2 is also supplied to a gate signal forming circuit 4 to derive therefrom such a gate signal Pb as shown in FIG. 2B which is synchronized with the signal Pa to be measured and has a pulse width of, for example, about one second. The gate signal Pb is applied to the gate circuits 3a and 3b. The gate circuit 3a controls by gating the signal Pa which is supplied to a first counter 5a, while the gate circuit 3b controls by gating a clock pulse Pc which is applied to a second counter 5b. The clock pulse Pc is shown in FIG. 2C, and is derived from a clock pulse generator 6. Thus, the signal P*a* and the clock pulse P*c* are respectively counted by the first and second counters 5*a* and 5*b* for the duration of the gate signal P*b*, and their count values L and M are supplied to an arithmetic circuit 7.

A fraction detector circuit 8 is provided, which is supplied with the clock pulse P*c* and the gate signal P*b* to detect a time interval or difference $\Delta T_1$ between the leading edge of the gate pulse P*b* and the clock pulse P*c* immediately following it, and a time interval or difference $\Delta T_2$ between the trailing edge of the gate pulse P*b* and the clock pulse P*c* immediately following it, as depicted in FIG. 2C. The time differences $\Delta T_1$ and $\Delta T_2$ thus detected are digitized by an A–D converter 9, and applied to the arithmetic circuit 7.

In the arithmetic circuit 7, only the integer part of the frequency F of the signal P*a* to be measured is obtained by performing an operation L·N/(M − 1)·T (where T is the pulse interval of the clock pulse P*c* and N the dividing frequency of the frequency divider 2). But, by applying the time differences $\Delta T_1$ and $T - \Delta T_2$ to the arithmetic circuit 7 and performing an operation $$\frac{L \cdot N}{(M - 1) \cdot T + \Delta T_1 + T - \Delta T_2},$$

an accurate frequency including a fractional value less than one period can be obtained, and is displayed by a digital display 10.

With the measuring device shown in FIG. 1, the signal P*a* can be measured including the fractional value less than one period of the signal, so that highly accurate frequency measurement can be achieved. However, this system involves the two gate circuits 3*a* and 3*b*, the two counters 5*a* and 5*b* and the arithmetic circuit 7 for performing an operation including division as described above, and hence is complicated in the circuit construction as a whole and expensive.

Figure 3:
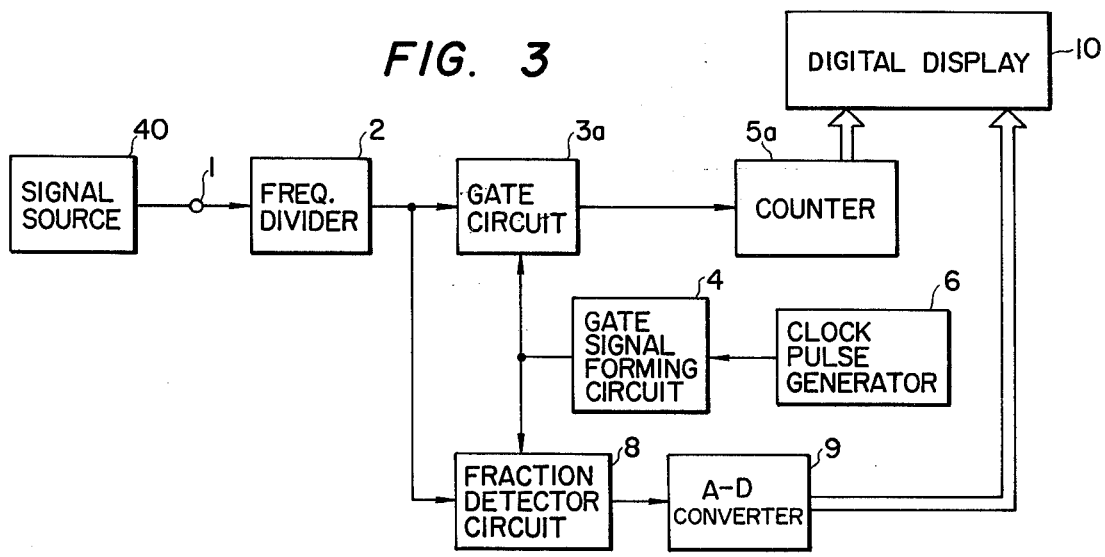
FIG. 3 is a block diagram illustrating an embodiment of a digital frequency measuring device of this invention.
Figure 4:
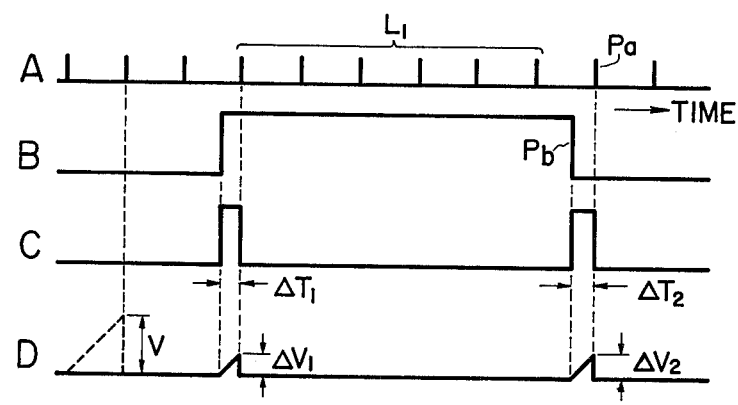
FIG. 4 is a waveform diagram explanatory of the operation of the device exemplified in FIG. 3.

FIG. 3 illustrates in block form an embodiment of a digital frequency measuring device according to this invention. In FIG. 3, parts corresponding to those in FIG. 1 are identified by the same reference numerals. The clock pulse from the clock pulse generator 6 is applied to the gate signal forming circuit 4 to provide the gate signal P*b* of unit time width, for instance, one second (refer to FIG. 4B), by which the gate circuit 3*a* is controlled to be opened and closed. The gate circuit 3*a* is supplied with the signal P*a* (FIG. 4A) from the signal source 40 through the 1/N frequency divider 2, and the gated output is counted by the counter 5*a*. The resulting count value is a value indicative of the unit time, for example, one second, so that the numerical value itself indicates the frequency. The count value thus obtained is applied to the digital display 10 to indicate, for instance, the measured numerical value above the decimal point.

On the other hand, the numerical value below the decimal point is obtained by converting the output from the fraction detector circuit 8 by the A–D converter 9 into a digital form. With the present invention, in the fraction detector circuit 8, there are produced voltages $\Delta V_1$ and $\Delta V_2$ (refer to FIG. 4D) which are respectively proportional to the time differences between integral multiples of the signal P*a* to be measured and the gate signal P*b*, that is, the time $\Delta T_1$ between the leading edge of the gate signal P*b* and the input pulse P*a* immediately following it, and the time $\Delta T_2$ between the trailing edge of the gate signal P*b* and the input pulse P*a* immediately following it, and there is produced the ratio ($\Delta V_1$ − $\Delta V_2$)/V, that is, the ratio of the voltage difference $\Delta V_1$ − $\Delta V_2$ between the voltages $\Delta V_1$ and $\Delta V_2$ to one period of the signal P*a*. The voltage ratio is converted by the A–D converter 9 into a digital signal to obtain the fraction of the measured frequency below the decimal point.

That is, if the count value of the counter 5*a* is taken as L, the frequency F of the signal P*a* is given as follows:

$$F = (L - 1) + \frac{\Delta T_1}{T} + \frac{T - \Delta T_2}{T} \quad (1)$$

$$= L + \frac{\Delta T_1 - \Delta T_2}{T} \quad (2)$$

It is difficult to accurately measure the very short time intervals $\Delta T_1$ and $\Delta T_2$, so that, in the present invention, the time intervals $\Delta T_1$ and $\Delta T_2$ and the pulse interval T of the clock pulse P*c* are respectively integrated by integrators and converted into the voltage values $\Delta V_1$, $\Delta V_2$ and V for the arithmetic operation. Accordingly, the frequency F becomes as follows:

$$F = L + \frac{\Delta V_1 - \Delta V_2}{V} \quad (3)$$

Thus, the small numerical value below the decimal point is also counted and this numerical value can be displayed as a fraction by the digital display 10.

Figure 5:
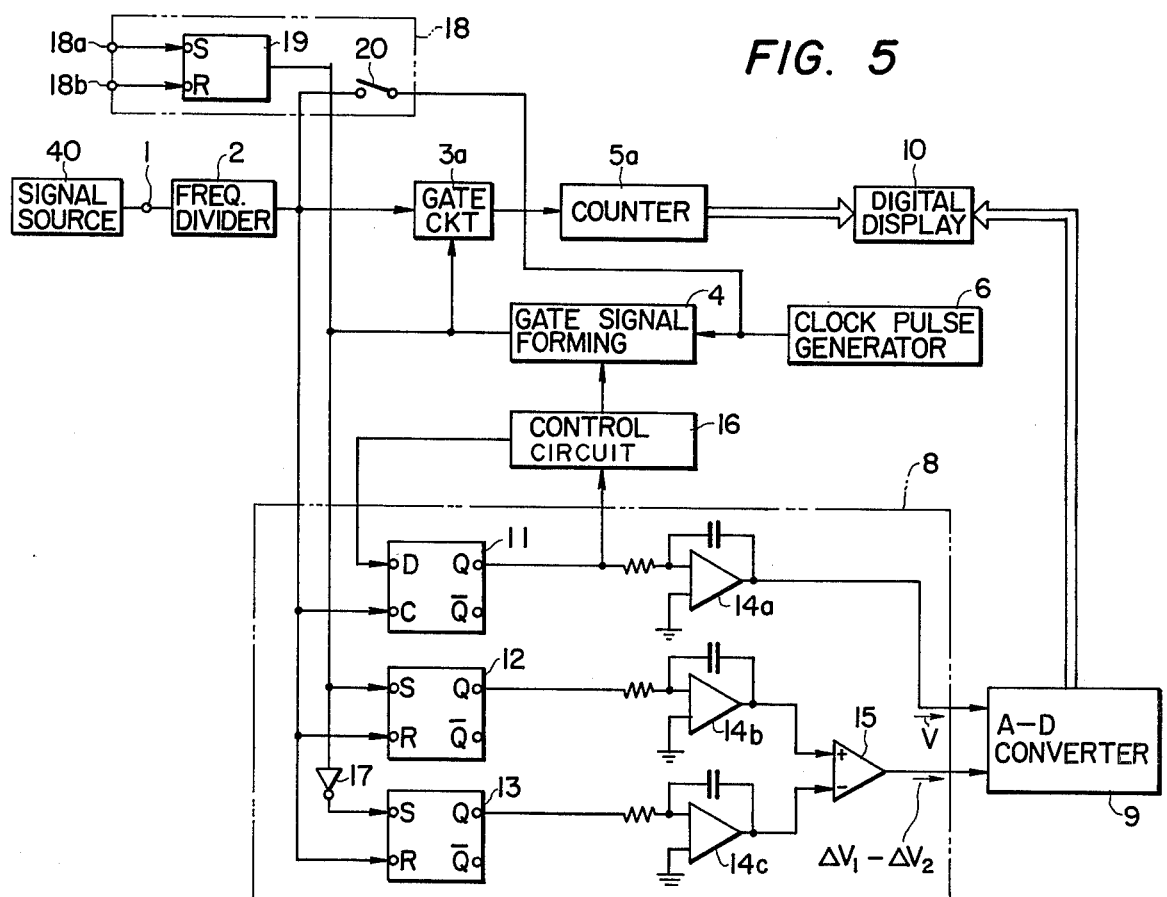
FIG. 5 is a block diagram showing in detail an example of the principal part of the digital frequency measuring device of this invention.

With reference to FIG. 5, a detailed description will be given of the principal part of the digital frequency measuring device according to this invention.

Figure 6:
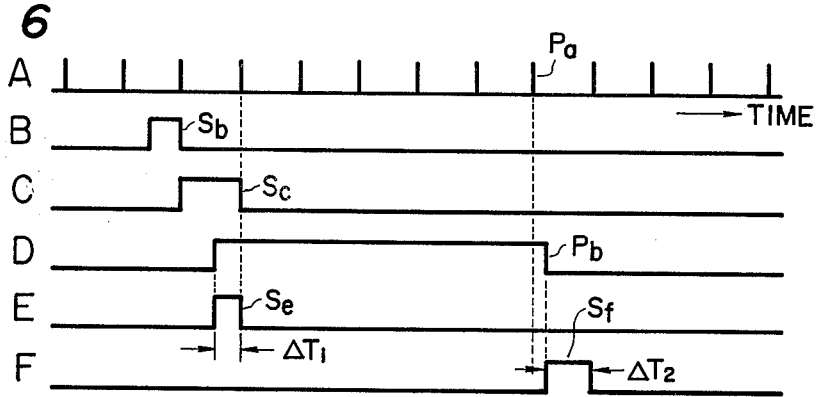
FIG. 6 is a waveform diagram explanatory of the operation of the part shown in FIG. 5.

The signal P*a* to be measured (FIG. 6A), supplied to the input terminal 1, is applied through the 1/N frequency divider 2 and the gate circuit 3*a* to the counter 5*a*, and its count value is displayed by the digital display 10 in the same manner as described above. Now, a specific construction of the fraction detector circuit 8 will be described. In the illustrated example, the fraction detector circuit 8 comprises one D type flip-flop circuit 11, two set-reset type flip-flop circuits 12 and 13, integrators 14*a*, 14*b* and 14*c* respectively connected to the output sides of the flip-flop circuits 11, 12 and 13, and a differential amplifier 15 for obtaining the difference between the integrated outputs from the integrators 14*b* and 14*c*.

A clock terminal C of the D type flip-flop circuit 11 and reset terminals R of the flip-flop circuits 12 and 13 are supplied with the signal P*a*, and a data terminal D of the D type flip-flop circuit 11 is supplied with, for example, a measurement start control signal S*b* (FIG. 6B) from a control circuit 16. When the signal P*a* arrives at the D type flip-flop circuit 11 while the measurement start control signal S*b* has a logic "1" to provide the logic "1" at the terminal D of the flip-flop circuit 11, the output at its output terminal Q becomes of the logic "1". The logic "1" output is supplied to the integrator 14*a* and the control circuit 16. When supplied with the logic "1", the control circuit 16 inverts the control signal to the terminal D of the flip-flop circuit 11 to a logic "0". Upon arrival of the next input pulse P*a*, the logic "0" at the terminal D is read in the flip-flop circuit 11 to return its output terminal Q to the logic "0". Accordingly, at the start of measurement, the integrator 14*a* is supplied with a pulse S*c* (FIG. 6C) whose duration corresponds to one period of the signal P*a* and, for the time T, a certain current is integrated by the integrator 14*a* to derive at its output the integrated voltage V corresponding to one period of the signal P$a$.

On the other hand, the set terminal S of the flip-flop circuit 12 is supplied with the gate signal P$b$ (FIG. 6D) from the gate signal forming circuit 4, and set by rising of the leading edge of the gate signal P$b$ to put the output from the flip-flop circuit 12 to the logic "1", and reset by the subsequent input pulse P$a$. Consequently, the integrator 14$b$ is supplied with a pulse S$e$ (FIG. 6E) whose duration corresponds to the time difference $\Delta T_1$ between the leading edge of the gate signal P$b$ and the immediately subsequent input pulse P$a$, deriving at the output of the integrator 14$b$ the integrated voltage $\Delta V_1$ proportional to the time difference $\Delta T_1$. The gate signal P$b$ is polarity inverted by an inverter 17, and applied to the set terminal S of the flip-flop circuit 13. The flip-flop circuit 13 is set from the trailing edge of the gate signal P$b$, and reset upon arrival of the next input pulse P$a$. Accordingly, the integrator 14$c$ is supplied with a pulse (FIG. 6F) whose duration corresponds to the time difference $\Delta T_2$ between the trailing edge of the gate signal P$b$ and the next subsequent input pulse P$a$ and, as a result of this, the integrated voltage proportional to the time difference $\Delta T_2$ is obtained at the output of the integrator 14$c$. The outputs $\Delta V_1$ and $\Delta V_2$ from the integrators 14$b$ and 14$c$ are applied to the differential amplifier 15 to derive at its output the difference voltage $\Delta V_1 - \Delta V_2$. The ratio $(\Delta V_1 - \Delta V_2)/V$ of the voltage $\Delta V_1 - \Delta V_2$ to the voltage V from the integrator 14$a$ is converted by the A–D converter 9 into the corresponding digital value. The A-D converter 9 may be, for example, a digital voltmeter, by which the value of the difference voltage $\Delta V_1 - \Delta V_2$ is measured using, as the reference value, the voltage V corresponding to one period of the signal P$a$, thereby obtaining the digital value of the voltage ratio $(\Delta V_1 - \Delta V_2)/V$. This digital value is the fraction of the count value derived from the counter 5$a$, and may be displayed, for instance, on the portion after the decimal point of the display 10.

The digital frequency measuring device described above is also applicable to measurement of the time width or the pulse interval. To this end, a pulse interval measuring circuit 18 is added, whose input terminals 18$a$ and 18$b$, respectively supplied with a start signal and a stop signal, are connected to the set terminal S and the reset terminal R of the flip-flop circuit 19, respectively. In place of the output from the gate signal forming circuit 4, the output from a flip-flop circuit 19 is applied to the gate circuit 3$a$ and the set terminal S of each of the flip-flop circuits 12 and 13. Further, in place of the output from the 1/N frequency divider 2, the clock pulse from the clock pulse generator 6 is supplied to the gate circuit 3$a$ through a switch 20 and, at the same time, applied to the clock terminal C of the D type flip-flop circuit 11 and the reset terminal R of each of the flip-flop circuits 12 and 13. In the measurement, the switch 20 is turned on to apply the start and the stop pulse to the input terminals 18$a$ and 18$b$ to open the gate circuit 3$a$ for a period of time corresponding to the pulse interval to be measured, and the clock pulses having passed through the gate circuit 3$a$ in the above period of time are counted by the counter 5$a$. Further, its function value is detected by the fraction detector circuit 8, and displayed by the display 10. Accordingly, with the present invention, the pulse interval can also be measured with high accuracy.

As has been described in the foregoing, according to the digital frequency measuring device of this invention, the fraction value, which is smaller than one period of the signal to be measured, can also be obtained in addition to the count value of the counter 5$a$, so that highly accurate frequency or pulse interval measurement can be achieved. With this invention, since one gate circuit, one counter and one arithmetic circuit can be omitted from the measurement system shown in FIG. 1, the circuit construction of this invention can be simplified. Further, for the purpose of enhancing the accuracy of measurement, the measuring device of this invention is adapted to obtain a fraction value of two to three digits from the time difference between the leading and trailing edges of the gate signal and pulses of the input signal to be measured, so that resolving power can be improved to $1/10^2$ to $1/10^3$. And, even if the frequency of the signal to be measured is divided down to 1/N by the 1/N frequency divider 2 provided at the stage preceding the gate circuit 3$a$, the gate time of the gate circuit 3$a$ need not be extended and highly accurate frequency measurement can be performed with a short gate time. Moreover, even if the frequency of the signal to be measured is divided down to a certain frequency at the preceding stage of the gate circuit 3$a$, since the measuring time need not be extended, high frequencies can also be measured with high accuracy.

In other words, in the frequency measurement by opening the gate circuit for the unit time and counting the number of pulses of signal to be measured which pass through the gate circuit, where the frequency of the signal to be measured is divided down to 1/N by a frequency divider provided at the stage preceding the gate circuit, if the frequency is to be measured with the same accuracy as in the case where the frequency division does not take place, it is necessary to extend the gate time N times and increase the time for measurement. In general, a decimal counter is employed as the counter for display, and if it is formed with a flip-flop circuit, a feedback circuit and some other circuits are needed, resulting in reduced response speed. In the case of measuring a frequency to which this counter cannot respond, the frequency to be measured is usually divided down to 1/N to which the counter can respond, and then applied to the gate circuit. In this case, the gate time must be extended N times and the time for measurement becomes long. With the digital frequency measuring device of this invention, however, the accuracy of measurement can be raised more than two to three digits by the detection of fraction. Accordingly, if it is required merely to measure the frequency of a signal with the same accuracy as in the case of measuring with the counter only, the gate time can be shortened to $1/10^2$ to $1/10^3$ of that in the latter case.

Further, since the frequency of the signal to be measured, which is applied to the gate circuit 3$a$, can be reduced, the gate circuit and the counter 5$a$ may be inexpensive ones. Accordingly, this invention has a merit of providing an inexpensive but highly accurate frequency measuring device which requires less circuit elements.

In the foregoing, the time differences between the leading and trailing edges of the gate signal and the input pulses arriving immediately after them are taken as $\Delta T_1$ and $\Delta T_2$, respectively. But it is also possible that the time differences between the leading and trailing edges of the gate signal and the time until arrival of a predetermined number of input pulse signals, for example, two, after the leading and trailing edges of the gate signal, respectively, are used as $\Delta T_1$ and $\Delta T_2$. In such a case, the voltage corresponding to the period T is also integrated for a period of time 2T and an operation $2(\Delta T_1 - \Delta T_2)/2T$ is performed. It will reasily be understood that this also provides exactly the same results as obtainable with the foregoing example. Further, the frequency divider may also be left out.

It will be seen that many modifications and variations may be effected without departing from the scope of novel concepts of this invention.

What is claimed is:

1. A digital frequency measuring device comprising:
   a gate circuit supplied with an input pulse signal to be measured in frequency and controlled by a gate signal to be opened and closed;
   a gate signal forming circuit for generating and supplying the gate signal of unit time to the gate circuit;
   a counter supplied with the input pulse signal having passed through the gate circuit to count the input pulses;
   a fraction detector circuit supplied with the gate signal and the input pulse signal for performing an operation $(\Delta T_1 - \Delta T_2)/T$ where $\Delta T_1$ and $\Delta T_2$ are the time intervals between the leading and trailing edges of the gate signal and the input pulses respectively following them in predetermined relationships thereto, and T is the period of the input pulse signal;
   an A–D converter supplied with the result of operation from the fraction detector circuit to convert it into a digital value; and
   a display for displaying the output from the A–D converter as the count value of the counter and a number below its minimum unit.

2. A digital frequency measuring device according to claim 1, where the fraction detector circuit comprises three integrators for integrating certain values for the periods of time $\Delta T_1$, $\Delta T_2$ and T to obtain voltages $\Delta V_1$, $\Delta V_2$ and V, respectively, and adapted to perform an operation $(\Delta V_1 - \Delta V_2)/V$.

3. A digital frequency measuring device according to claim 1, wherein the fraction detector circuit comprises three integrators for integrating certain values for the periods of time $\Delta T_1$, $\Delta T_2$ and T to obtain voltages $\Delta V_1$, $\Delta V_2$ and V, respectively, and a differential amplifier supplied with the voltages $\Delta V_1$ and $\Delta V_2$ to obtain a difference voltage $\Delta V_1 - \Delta V_2$, and wherein the voltages V and $\Delta V_1 - \Delta V_2$ are applied to a digital voltmeter serving as the A–D converter to measure the voltage $\Delta V_1 - \Delta V_2$ using the voltage V as the reference voltage, the digital value of the measured voltage being applied to the display.

4. A digital frequency measuring device according to claim 1, wherein the fraction detector circuit includes a D type flip-flop circuit and first and second set-reset type flip-flop circuits; the input pulse signals are supplied to a clock terminal of the D type flip-flop circuit and reset terminals of the first and second set-reset type flip-flop circuits; the output from a control circuit is supplied to a data terminal of the D type flip-flop circuit; the control circuit is inverted by the output from the D-type flip-flop circuit to provide the voltage V at the output terminal of the D type flip-flop circuit; and the gate signal and its inverted signal are respectively applied to set terminals of the first and second set-reset flip-flop circuits to derive the voltages $\Delta V_1$ and $\Delta V_2$ at their output terminals.

5. A digital frequency measuring device according to claim 1, wherein there is provided a time width measuring circuit for generating a second gate signal of a duration to be measured, and wherein the second gate signal is applied to the gate circuit and the fraction detector circuit in place of the gate signal, and a reference clock pulse being applied to the gate circuit and the fraction detector circuit in place of the input pulse signal.

* * * * *